United States Patent
Freudenberger et al.

(10) Patent No.: US 10,790,855 B2
(45) Date of Patent: Sep. 29, 2020

(54) METHOD AND DEVICE FOR ERROR CORRECTION CODING BASED ON HIGH-RATE GENERALIZED CONCATENATED CODES

(71) Applicant: HYPERSTONE GMBH

(72) Inventors: Juergen Freudenberger, Radolfzell (DE); Jens Spinner, Constance (DE); Christoph Baumhof, Radolfzell (DE)

(73) Assignee: HYPERSTONE GMBH, Constance (DE)

( * ) Notice: Subject to any disclaimer, the term of this patent is extended or adjusted under 35 U.S.C. 154(b) by 7 days.

(21) Appl. No.: 16/395,046

(22) Filed: Apr. 25, 2019

(65) Prior Publication Data
US 2019/0268023 A1 Aug. 29, 2019

Related U.S. Application Data

(63) Continuation of application No. 15/593,973, filed on May 12, 2017, now Pat. No. 10,320,421.

(30) Foreign Application Priority Data

May 13, 2016 (DE) .................. 10 2016 005 985
Apr. 6, 2017 (DE) .................. 10 2017 107 431

(51) Int. Cl.
*H03M 13/00* (2006.01)
*H03M 13/25* (2006.01)
(Continued)

(52) U.S. Cl.
CPC .......... *H03M 13/253* (2013.01); *G11C 29/52* (2013.01); *H03M 13/1505* (2013.01);
(Continued)

(58) Field of Classification Search
None
See application file for complete search history.

(56) References Cited

U.S. PATENT DOCUMENTS 7,296,212 B1 * 11/2007 Hammons, Jr. ... H03M 13/2909
714/701
7,484,159 B2 * 1/2009 Kan ..................... H03M 13/116
714/755
(Continued)

OTHER PUBLICATIONS

A. Fahrner, H. Griesser et al "Low-complexity GEL codes for digital magnetic storage systems," IEEE Transactions on Magnetics, vol. 40, No. 4 Jul. 2004.
(Continued)

*Primary Examiner* — Mujtaba M Chaudry
(74) *Attorney, Agent, or Firm* — HDC IP Law

(57) ABSTRACT

Field error correction coding is particularly suitable for applications in non-volatile flash memories. We describe a method for error correction encoding of data to be stored in a memory device, a corresponding method for decoding a codeword matrix resulting from the encoding method, a coding device, and a computer program for performing the methods on the coding device, using a new construction for high-rate generalized concatenated (GC) codes. The codes, which are well suited for error correction in flash memories for high reliability data storage, are constructed from inner nested binary Bose-Chaudhuri-Hocquenghem (BCH) codes and outer codes, preferably Reed-Solomon (RS) codes. For the inner codes extended BCH codes are used, where only single parity-check codes are applied in the first level of the GC code. This enables high-rate codes.

20 Claims, 5 Drawing Sheets

(51) Int. Cl.
*G11C 29/52* (2006.01)
*H03M 13/29* (2006.01)
*H03M 13/15* (2006.01)

(52) U.S. Cl.
CPC ..... *H03M 13/293* (2013.01); *H03M 13/2906* (2013.01); *H03M 13/152* (2013.01); *H03M 13/1515* (2013.01)

(56) References Cited

U.S. PATENT DOCUMENTS

| | | | | |
|---|---|---|---|---|
| 2006/0200724 A1* | 9/2006 | Stankovic | ......... | H03M 13/6312 714/758 |
| 2006/0200733 A1* | 9/2006 | Stankovic | ............... | H03M 7/30 714/801 |
| 2007/0067695 A1* | 3/2007 | Griesser | ............ | H03M 13/2906 714/755 |
| 2009/0040081 A1* | 2/2009 | Yang | ................. | H03M 13/2945 341/94 |

OTHER PUBLICATIONS

J. Freudenberger, et al "Concatenated code constructions for error correction in non-volatile memories," (ISSSE), Oct. 2012.
Freudenberger et al "Generalized concatenated codes for correcting two-dimensional clusters of errors and independent errors" Int. conference (CSP) Feb. 2014.
Spinner et al "Decoder architecture for generalized concatenated codes" IET Circuits, Devices & Systems vol. 9, No. 5, 2015.
I. Dumer, "Concatenated codes and their multilevel generalizations" Handbook of Coding Theory, vol. 2, Elsevier, Amsterdam 1998.
M. Bossert, "Channel coding for telecommuncations" Wiley. 1999 English description of book.
V. Zyablov et al "An introduction to generalized concatenated codes" European Trans. on Telecomunications vol. 10 No. 6 1999.
R. Micheloni et al "Error correction codes for non-volatile memories" Springer, 2008—English description of the book.
X Zhang et al "High-speed architectures for parallel long BCH encoders" IEEE Transactions on Very Large Scale Integration (VLSI) Systems vol. 13 No. 7 2005.
F. Sun et al Design of on-chip error corrction systems for multilevel NOR and NAND flash memories: IET Curcuits, Devices systems, vol. 1 No. 3 Jun. 2007.
E. Yaakobi et al "Error characterization and coding schemes for flash memories" IEEE Globecom Workshops, Dec. 2010.
E. Yaakobi et al "Characterization and error-correcting codes for TLC flash memories" Computing, Networking and communications, International Conf. Jan. 2012.
J. Freudenberger et al "A configurable Bose-Chaudhuri-Hocquenghem codec architecture for flash controller applications" Journal of Circuits, systems and computers Feb. 2014.
Spinner et al "Design and Implementation of a pipelined decoder for generalized concatenated codes" Proceedings of 27th SBCCI Aracaju, Brazil Sep. 2014.
L. Welburn et al "Improved performance of Reed-Solomon decoding with the use of pilot signals for erasure generation" VTC 98 48th IEEE vol. 3, May 1998.
J. Wachsmann "Multilevel codes: theoretical concepts and practical design rules" IEEE Transactions on Information Theory vol. 45, No. 5 Jul. 1999.
Spinner et al "Soft input decoding of generalized concatenated codes using a stack decoding algorithm "Proceedints of 2nd BW-CAR (SinCom). Dec. 2015.

* cited by examiner

METHOD AND DEVICE FOR ERROR CORRECTION CODING BASED ON HIGH-RATE GENERALIZED CONCATENATED CODES

CROSS-REFERENCE TO RELATED APPLICATION

This application is a continuation of U.S. patent application Ser. No. 15/593,973 of the same title and having the same inventor, and filed May 12, 2017; which in turn claims priority under 35 USC § 119, of German patent application DE 10 2016 005 985.0, filed May 13, 2016, and of German patent application DE 10 2017 107 431.7, filed Apr. 6, 2017. Each of the aforementioned applications is incorporated by reference for all purposes.

BACKGROUND OF THE INVENTION

Field of the invention

The present invention relates to the field of error correction coding, in particular for applications in non-volatile flash memories. Specifically, the invention is directed to a method of error correction encoding of data to be stored in a memory device, a corresponding method for decoding a codeword matrix resulting from the encoding method, a coding device adapted to perform one or more of these methods, and a corresponding computer program for performing said methods on the coding device.

Error correction coding (ECC) based on Generalized Concatenated Codes (GC codes) has a high potential for various applications in data communication and data storage systems, e.g., for digital magnetic storage systems as described n reference [1] (see list of references [ . . . ] at the end of written specification), for non-volatile flash memories (cf. [2]), and for two-dimensional bar codes (cf. [3]). In particular, GC codes may be used for error correction in flash memories as proposed in [2] and [4].

In particular, such GC codes may be constructed from inner nested binary Bose-Chaudhuri-Hocquenghem (BCH) codes and outer Reed-Solomon (RS) codes, as generally described for example in [5], [6] and [7], and are well suited for fast hardware decoding architectures (cf. [4]). In coding theory, the BCH codes form a class of linear cyclic error-correcting codes that are constructed using finite fields (Galois Fields, GF) while the Reed-Solomon codes belong to the class of non-binary cyclic error-correcting codes and are based on univariate polynomials over finite fields (GF).

Flash memories, particularly NAND flash memories, are important components in embedded systems as well as in consumer electronics. Flash memories require ECC to ensure data integrity and reliability for the user data (cf. [8]). With many flash technologies, the statistic model of the errors can be assumed to be a binary symmetric channel (BSC). Hence, typically BCH codes are used for error correction, as described for example in [9], [10], [11], [12] and [13]. GC codes have a low decoding complexity compared to long BCH codes. Flash memories typically reserve a spare memory area that is used to store the redundancy required for the ECC. This spare area determines the code rate of the error correction code.

SUMMARY OF THE INVENTION

It is accordingly an object of the invention to provide a method and device for error correction coding which overcome the above-mentioned and other disadvantages of the heretofore-known devices and methods of this general type and which provide, in particular, for improved code rates. Specifically, it is desirable that such methods and devices are suitable for improved ECC encoding/decoding of data in connection with the storage/reading of the data in/from a memory, such as a non-volatile memory.

With the foregoing and other objects in view there is provided, in accordance with the invention, a method of error correction encoding of data to be stored in a memory device, the method comprising:

providing a coding device;

using the coding device to subject the data to error correction encoding based on generalized concatenated coding (GCC) to obtain encoded data; wherein:

the GCC is constructed from L inner nested binary extended Bose-Chaudhuri-Hocquenghem (BCH) codes and L outer codes, where L≥2 and L is a positive integer;

an extended BCH code in a lowest nesting level of the inner nested BCH codes is a mere single parity-check (SPC) code; and an extended BCH code in at least one higher nesting level of the inner nested BCH codes has an error correction capability and is a sub-code of the BCH code of the lowest nesting level.

A first aspect of the invention is directed to a method of error correction encoding of data to be stored in a memory device, the method being performed by a coding device and comprising applying error correction encoding based on generalized concatenated coding, GCC, to the data to obtain encoded data. Therein, (i) the GCC is constructed from L inner nested binary extended Bose-Chaudhuri-Hocquenghem, BCH, codes and L outer codes, preferably Reed-Solomon codes (RS-codes), wherein L≥2 is a positive integer, (ii) the extended BCH code in the lowest nesting-level of the inner nested BCH codes is a mere single parity-check, SPC, code, and (iii) the extended BCH code in at least one higher nesting-level of the inner nested BCH codes has an error correction capability (in contrast to the SPC code, which can only detect certain errors) and is a sub-code of the BCH code of the lowest nesting level.

The term "extended BCH code," as used herein, refers to a code the codewords of which generally comprise both a BCH codeword and an additional single parity check (SPC) symbol (i.e. a parity bit, if the SPC symbol is only a single bit). However, even a mere SPC-code (without further BCH parity symbols) is already an extended BCH code, in fact it is its simplest form. While a BCH code (that is not a mere SPC code) enables correction of a certain number of errors in a codeword at the decoding side, an SPC code only enables detecting certain errors, specifically if there is an odd number of errors in the codeword.

The term "sub-code" of a particular (parent) BCH code, as used herein, refers to a code consisting of a strict subset of the codewords of said (parent) BCH code. Thus, a BCH code $B^{(n)}$ is a subset of another BCH code $B^{(m)}$, if the set of the codewords of $B^{(n)}$ is a strict subset of the set of codewords of $B^{(m)}$. Specifically, the sub-code may be the BCH code of a particular nesting level of the nested structure of the inner nested BCH codes, which sub-code is a subset of a lower-level BCH code of the nested structure. Accordingly, in the nested structure $B^{(L-1)} \subseteq B^{(L-2)} \subseteq \ldots \subseteq B^{(0)}$ the BCH code $B^{(L-q)}$ with L>q>0 and q being an integer is a sub-code of at least the BCH code $B^{(0)}$ of the lowest nesting level 0 and, if q<L−1, of any higher nested BCH code defined between $B^{(0)}$ and $B^{(L-q)}$ in the nested structure. A nesting of the BCH codes with different levels is described particularly in [2] and [4].

In accordance with a preferred feature of the invention, the outer codes are block codes and most preferably RS codes.

While the code constructions presented in references [2] and [4], both of which are incorporated herein in their entirety by way of reference, are limited to codes with an overall code rate of less than or equal to 0.9, which is not applicable in flash memories that provide only a small spare memory area for storing the redundancy required for the ECC, the encoding method according to the first aspect of the present invention enables high rate GC codes with code rates above 0.9. Accordingly, such high rate GC codes can be used to encode data to be stored in memories, esp. flash memories, which provide only a small spare memory area. Despite the use of only SPC instead of higher BCH codes in the lowest nesting level, similar ECC error correction levels can be achieved and thus the efficiency (code rate) of the code can be increased. In other words, the efficiency of such memories in terms of their storage capacity for user data can be improved due to the increased code rate.

In the following, preferred embodiments of the encoding method of the first aspect are described, which can be arbitrarily combined with each other or with the other aspects of the present invention, unless such combination is explicitly excluded or technically impossible.

According to a first preferred embodiment, applying the error correction encoding comprises:

arranging the data to be encoded into a two-dimensional data matrix having a first dimension $n_a$ equal to the length of the outer RS codes and a second dimension $n_b$ equal to the length of the inner extended BCH codes, wherein a line of the first dimension of a matrix is a row of the matrix and a line of its second dimension is a column of the matrix, or vice versa, and the outer RS codes are defined over a Galois-Field $GF(2^{m_1})$ such that $m_1$ elements of each line of the second dimension represent one symbol of the Galois-Field $GF(2^{m_1})$;

applying the L outer RS codes to respective $L*m_1$ lines of the first dimension of the data matrix such that each of the L outer RS codes yields a codeword from respective $m_1$ lines of the second dimension and in total $L*m_1$ lines of the resulting intermediate matrix are protected by the outer RS codes, wherein $m_1$ is a positive integer, preferably m1>1; and thereafter applying the inner nested extended BCH codes to the lines of the second dimension of the intermediate matrix to obtain a codeword matrix comprising the encoded data such that $n_b-L*m_1$ lines of the first dimension of the codeword matrix are used for the coding redundancy of the inner nested extended BCH codes and each line of the second dimension of the codeword matrix is the sum of the L codewords of the individual nested extended BCH codes for that line.

This embodiment allows for a particularly efficient clearly structured implementation of the method of the first aspect of the present invention.

According to a related further preferred embodiment, the codeword $b_j$ of the j-th line of the second dimension of the codeword matrix is determined by the following formula:

$$b_j = \sum_{i=0}^{L-1} b_j^{(i)}$$

wherein the codewords $b_j^{(i)}$ are formed by encoding the symbols $a_{j,i}$ with the extended BCH code $B^{(i)}$ of the $i^{th}$ nesting level, where $a_{j,i}$ is the j-th symbol, of $m_1$ bits, of the $i^{th}$ outer RS code $A^{(i)}$ along the first direction of the intermediate matrix and for this encoding $(L-i-1)*m_1$ zero bits are prefixed or postfixed onto the symbol $a_{j,i}$. This embodiment particularly enables a simple, efficient and clearly structured implementation of the method, because due to the addition of the zero bits a constant length of the codewords of both the outer RS codes and the extended BCH codes being formed based thereon is achieved.

According to a further preferred embodiment, the code rate of the first RS codeword (corresponding to i=0 in the above sum) defined along the direction of the second dimension of the intermediate matrix is lower than the code rate of the $L^{th}$ RS codeword (corresponding to i=L−1 in the above sum) defined along that direction. Accordingly, this can be used to further increase the overall code rate of the code without compromising its level of protection. Such reduction of the code rates of the RS codewords along the direction of the second dimension of the matrix is enabled, because on the decoding side the structure of the overall GCC code resulting from the encoding allows for reusing the decoding results of a given level i for decoding the next level i+1.

According to a further preferred embodiment, the inner extended BCH codes are defined over a Galois-Field $GF(2^{m_2})$ and $m_1$ is different from $m_2$, wherein $m_2$ is a positive integer. In a first preferred variant hereof, $m_1=8$ and $m_2=6$. In a second preferred variant $m_1=9$ and $m_2=7$. Specifically, in said second variant the number of nesting-levels for the inner extended BCH codes is preferably 13 such that $n_a=152$ and $n_b=118$. Furthermore, for each of said nesting-levels j the corresponding code dimension of the inner extended BCH code $k_{b,j}$ and its minimum Hamming distance $d_{b,j}$ as well as the corresponding code dimension $k_{a,j}$ of the outer RS code and its minimum Hamming distance $d_{a,j}$ may be those as provided by the following table:

| j | $k_{b,j}$ | $d_{b,j}$ | $k_{a,j}$ | $d_{a,j}$ |
|---|---|---|---|---|
| 0 | 117 | 2 | 84 | 69 |
| 1 | 108 | 4 | 130 | 23 |
| 2 | 99 | 6 | 136 | 17 |
| 3 | 90 | 8 | 142 | 11 |
| 4-12 | 81 | 12 | 148 | 5 |

The GC code according to this embodiment is particularly suitable for error correction for data storage in flash memories. Specifically, this GC code is designed for 2 KB information blocks, i.e., a code which can be used to store 2 KB of data plus 4 bytes of meta information. This applies particularly to said second variant including when implemented according to the table above.

According to a further preferred embodiment, in the step of applying the inner nested extended BCH codes to the lines of the second dimension of the intermediate matrix at least in one of the nesting levels, preferably in the lowest nesting level, the single parity bit of the respective extended BCH code of said nesting level is calculated from a predefined strict subset of the bits of the respective line of the second dimension. Particularly, this may lead to increased performance of the encoding, as less bits need to be involved in calculating the parity symbols, respectively parity bits, of the SPC related to the respective extended BCH code(s).

According to a further preferred embodiment the method further comprises transmitting the obtained encoded data to one or more memory devices to store the data therein. Specifically, if—as described in preferred embodiments presented herein—the data to be encoded is arranged in a two-dimensional data matrix and thus the resulting encoded data is arranged in a corresponding two-dimensional codeword matrix, then the obtained encoded data to be stored comprises that codeword matrix, at least in parts.

A second aspect of the present invention is directed to a method of iterative error correction decoding of a codeword matrix based on generalized concatenated coding, GCC, wherein: the GCC is constructed from L inner nested binary extended Bose-Chaudhuri-Hocquenghem, BCH, codes and L outer codes, preferably Reed-Solomon codes (RS codes), wherein L≥2 is a positive integer; the extended BCH code in the lowest nesting-level of the inner nested BCH codes is a mere single parity-check, SPC, code; and the extended BCH code in at least one higher nesting-level of the inner nested BCH codes has an error correction capability and is a sub-code of the BCH code of the lowest nesting level.

The method of decoding comprises:

(i) a first iteration corresponding to the lowest nesting level of the inner extended BCH codes of the codeword matrix and having the following steps:

applying SPC-decoding to the lines of the second dimension of the codeword matrix with respect to the lowest nesting level of the inner nested extended BCH codes in which the lines of a second dimension of the codeword matrix are encoded in order to obtain an intermediate decoding data matrix of the first iteration and to determine erasure information characterizing lines of the second dimension of the codeword matrix in which an erasure has been detected based on the SPC-decoding;

inferring the information bits contained in the lines of the second dimension of the intermediate decoding data matrix of the first iteration in order to retrieve code symbols ($a_{i,j}$) of the outer RS codes in which the lines of a first dimension of the codeword matrix are encoded;

applying RS-decoding corresponding to the respective RS codes used for obtaining the original codeword matrix during encoding, to the retrieved code symbols in the lines of the first dimension of the intermediate decoding data matrix of the first iteration in order to obtain a partial decoding result matrix of the first iteration, wherein the erasure information is used during RS-decoding to identify erroneous RS-symbols in the intermediate decoding data matrix of the first iteration;

re-encoding said partial decoding result matrix of the first iteration by applying SPC-encoding to the second dimension of this matrix to obtain a re-encoded matrix of the first iteration; and subtracting the re-encoded matrix of the first iteration from the codeword matrix in order to obtain a start matrix for a subsequent further iteration; and (ii) for each of the further nesting levels of the inner extended BCH codes of the codeword matrix, a respective further iteration having the following steps:

applying extended BCH-decoding to the lines of the second dimension of the start matrix of the present iteration with respect to the present nesting level of the inner nested extended BCH codes in which the lines of a second dimension of the start matrix of the present iteration are encoded in order to obtain an intermediate decoding data matrix of the present iteration;

inferring the information bits contained in the lines of the second dimension of the intermediate decoding data matrix of the present iteration in order to retrieve code symbols of the outer RS codes in which the lines of a first dimension of the codeword matrix are encoded;

applying RS-decoding corresponding to the respective RS codes used for obtaining the original codeword matrix during encoding, to the retrieved code symbols in the lines of the first dimension of the intermediate decoding data matrix of the present iteration in order to obtain a partial decoding result matrix of the present iteration;

if the present iteration corresponds to the highest nesting level of the inner nested extended BCH codes in the codeword matrix, outputting the partial decoding result matrix of the present iteration as a data matrix resulting from the decoding, and otherwise, re-encoding said partial decoding result matrix of the present iteration by applying extended BCH-encoding corresponding to the present nesting level to the second dimension of this matrix to obtain a re-encoded matrix of the present iteration, and subtracting the re-encoded matrix of the present iteration from the start matrix of the present iteration in order to obtain a start matrix for a subsequent further iteration.

This method thus enables decoding of ECC encoded data arranged in a codeword matrix obtainable from application of the matrix based preferred embodiments of the encoding method described herein. This method enables increased code rates, particularly even code rates above 0.9. This becomes possible, because due to the interplay of SPC decoding and BCH-decoding in the first iteration, wherein the erasure information is used during RS-decoding to identify erroneous RS-symbols in the intermediate decoding data matrix of the first iteration, the reduction of parity symbols related to only SPC coding instead of BCH coding for the lowest nesting level yields additional space within the code for data without increasing the overall length of the GCC code or compromising its security level, in particular error correction capabilities. Furthermore, even performance improvements are enabled, because the processing of the SPC-based first iteration is less complex than that of the further BCH-based iterations.

According to a preferred embodiment of this decoding method, in at least one of the further iterations: (i) the step of applying extended BCH-decoding further comprises determining erasure information characterizing lines of the second dimension of the start matrix of the present iteration in which an erasure has been detected based on SPC-decoding a SPC-parity bit contained in the extended BCH code of the present iteration; and (ii) in the step of applying RS-decoding said erasure information of the present iteration is used during RS-decoding to identify erroneous RS-symbols in the intermediate decoding data matrix of the present iteration. Thus, the concept of interplay between the SPC decoding and the BCH-decoding is further extended. In particular, this may lead to further improvements in performance and/or code rate by allowing for use of extended BCH codes of higher code dimension k, i.e. less redundancy overhead.

A third aspect of the present invention is directed to a coding device, in particular to a semiconductor device comprising a memory controller. The coding device is adapted to perform the encoding method according to the first aspect and/or the decoding method of the second aspect, each of said methods preferably according to one or more of its preferred embodiments described herein.

According to a preferred embodiment hereof, the coding device comprises one or more processors, memory, and one or more programs being stored in the memory, which when executed on the one or more processors cause the coding device to perform said encoding method and/or said decoding method.

A fourth aspect of the present invention is directed to a computer program comprising instructions to cause a coding device, preferably the coding device of the third aspect, to perform the encoding method of the first aspect and/or the decoding method of the second aspect, the coding device and each of said methods preferably according to one or more of their respective preferred embodiments described herein.

The computer program may be implemented in particular in the form of a data carrier on which one or more programs for performing the method(s) are stored. Preferably, this is a data carrier, such as a CD, a DVD or a flash memory module. This may be advantageous, if the computer program is meant to be traded as an individual product independent from the processor platform on which the one or more programs are to be executed. In another implementation, the computer program is provided as a file on a data processing unit, preferably on a server, and can be downloaded via a data connection, e.g. the Internet or a dedicated data connection, such as a proprietary or local area network.

Accordingly, the herein-described properties and advantages of the methods of the first and/or second aspects of the present invention apply mutatis mutandis to the coding device according to the third aspect and the computer program according to the fourth aspect.

In particular, the present invention enables high-rate codes. Furthermore, the use of the extended BCH codes enables the detection of decoding failures for the inner codes. These failures can be exploited using the fact that the algebraic decoding procedures for relevant outer codes, in particular for RS codes, can correct both errors and erasures. If the outer RS decoding is configured to correct up to t errors, it corrects up to 2t erasures. Furthermore, these GC codes are in principle able to correct burst errors. The proposed GC codes are well suited for error correction in flash memories for high reliability data storage, because very low residual error probabilities can be achieved. The GC codes have a performance similar to that of mere BCH codes, but can be decoded faster and with a lower decoder complexity (cf. [4]). Furthermore, the GC codes can exploit reliability information from the channel [17].

Other features which are considered as characteristic for the invention are set forth in the appended claims.

Although the invention is illustrated and described herein as embodied in a method and a device for error correction coding based on high-rate generalized concatenated codes, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF PREFERRED EMBODIMENTS

Figure 1:
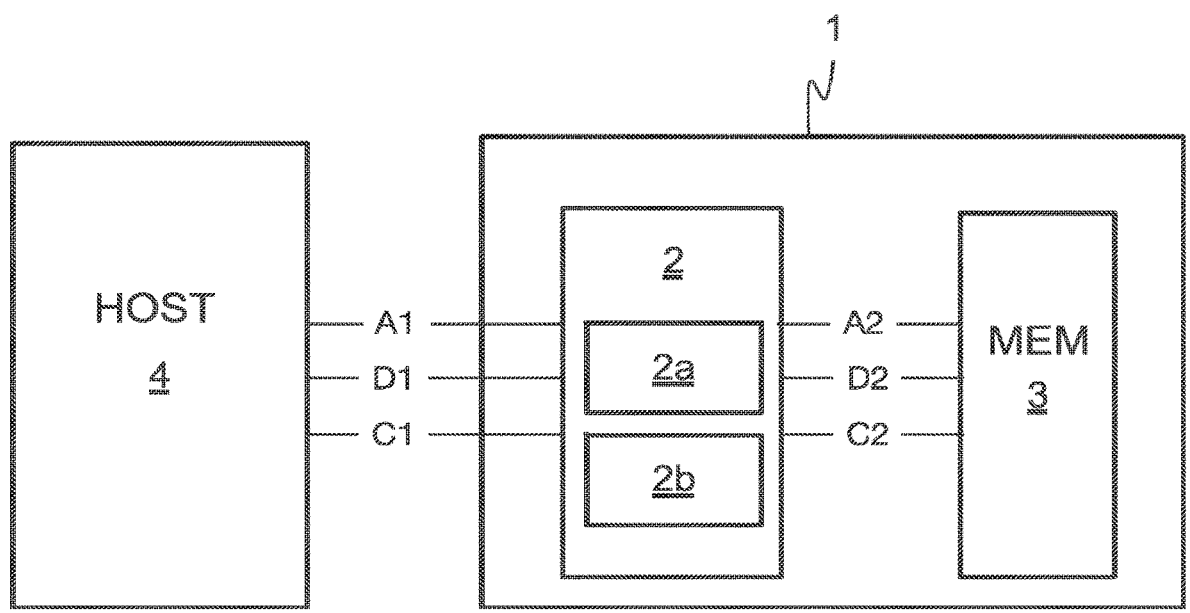
FIG. 1 schematically illustrates a coding device in the form of a memory controller within a memory system, according to a preferred embodiment of the present invention.

Referring now to the figures of the drawing in detail and first, particularly, to FIG. 1 thereof, there is shown an exemplary memory system 1 comprising a memory controller 2 and a memory device 3, which may particularly be a flash memory device, e.g. of the NAND type. The memory system 1 is connected to a host 4, such as a computer to which the memory system 1 pertains, via a set of address lines A1, a set of data lines D1 and set of control lines C1. The memory controller 2 comprises a processing unit 2a and an internal memory 2b, typically of the embedded type, and is connected to the memory 3 via an address bus A2, a data bus D2, and a control bus C2. Accordingly, host 4 has indirect read and/or write access to the memory 3 via its connections A1, D1 and C1 to the memory controller 2, which in turn can directly access the memory 3 via the buses A2, D2 and C2. Each of the set of lines respectively buses A1, D1, C1, A2, D2 and C2 may be implemented by one or more individual communication lines.

The memory controller 2 is also configured as a coding device and thus adapted to perform the encoding and decoding methods of the present invention, particularly as described below with reference to FIGS. 2 to 4. To that purpose, the memory controller 2 may comprise a computer program residing in its internal memory 2b which is configured to perform one or more of these coding methods when executed on the processing unit 2a of the memory controller 2. Alternatively, the program may for example reside, in whole or in part, in memory 3 or in an additional program memory (not shown) or may even be implemented by a hard-wired circuit.

Figure 2:
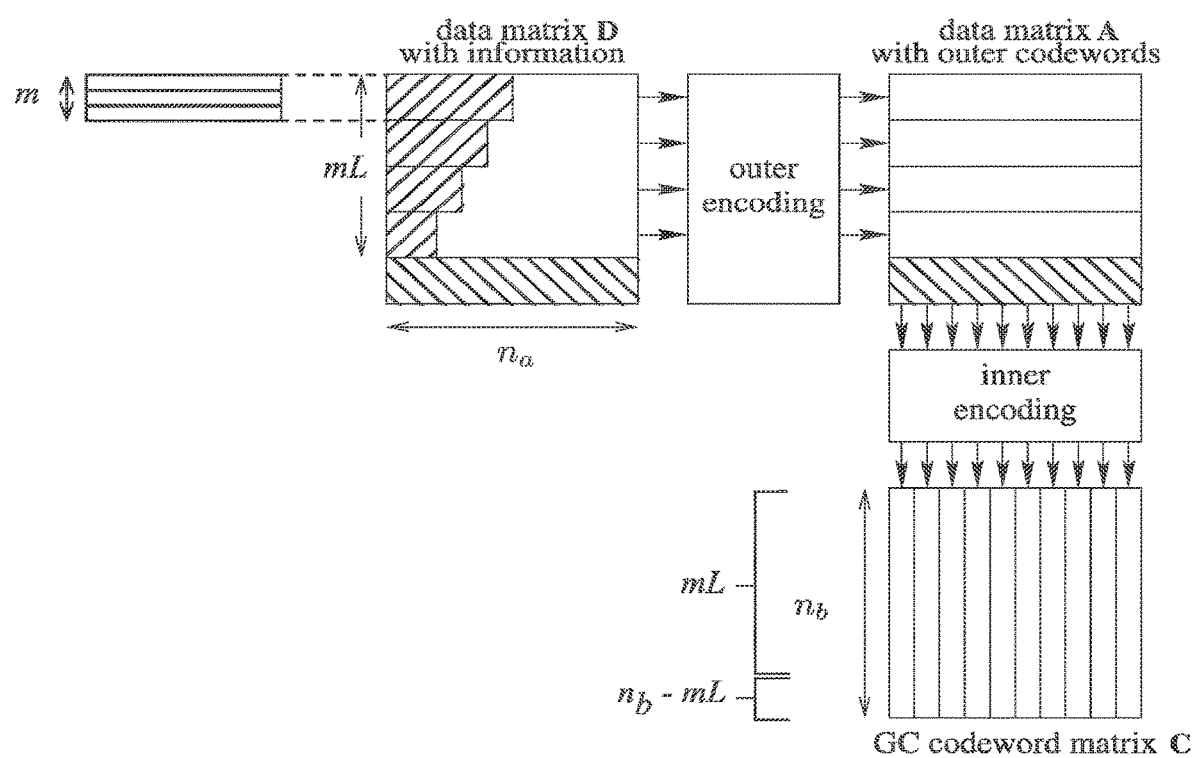
FIG. 2 schematically illustrates an encoding scheme for the transformation of a data matrix containing information to be encoded into a corresponding codeword matrix, according to a preferred embodiment of the present invention.
Figure 3:
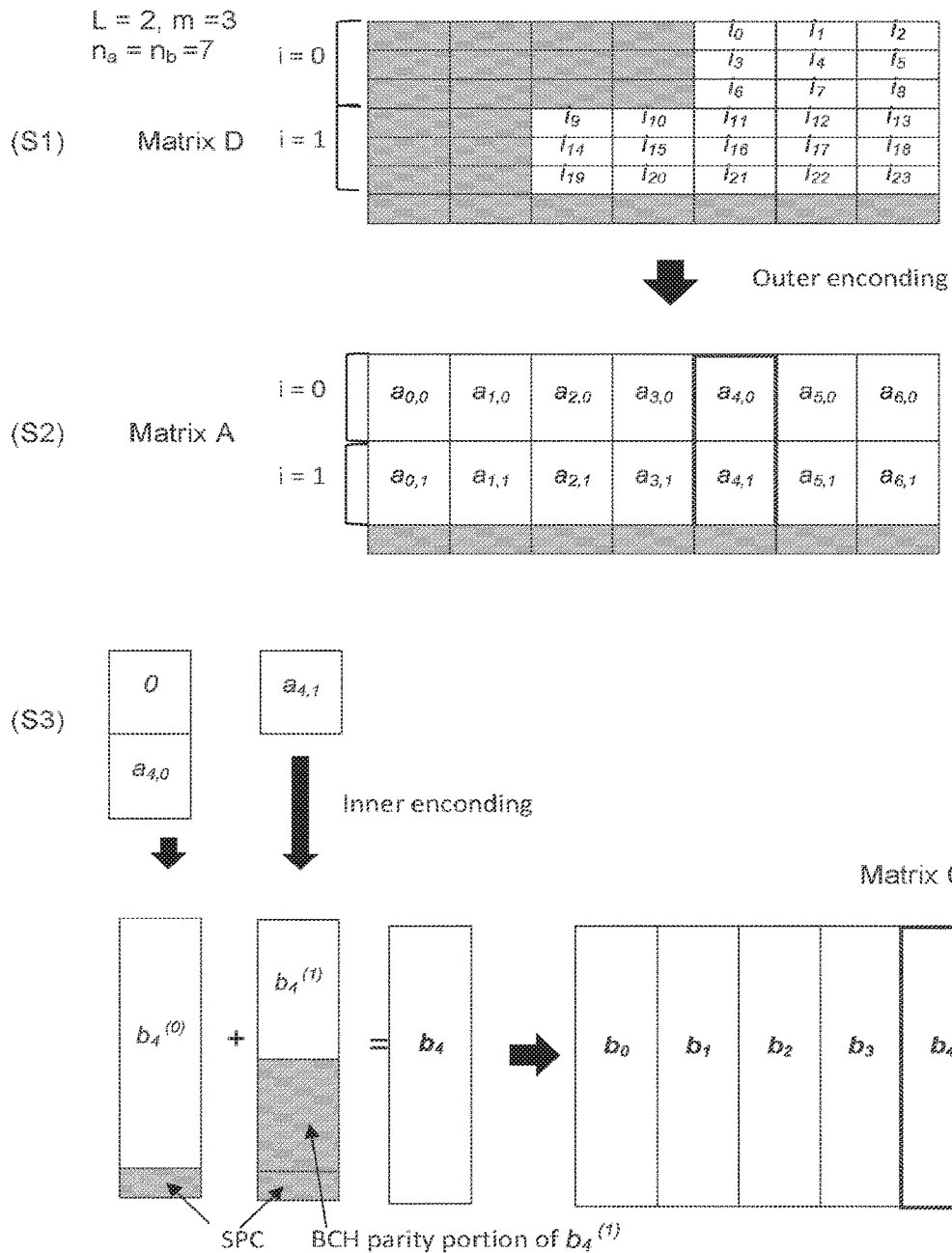
FIG. 3 schematically illustrates a simplified version of the encoding scheme of FIG. 2 in more detail, according to a preferred embodiment of the present invention.
Figure 4:
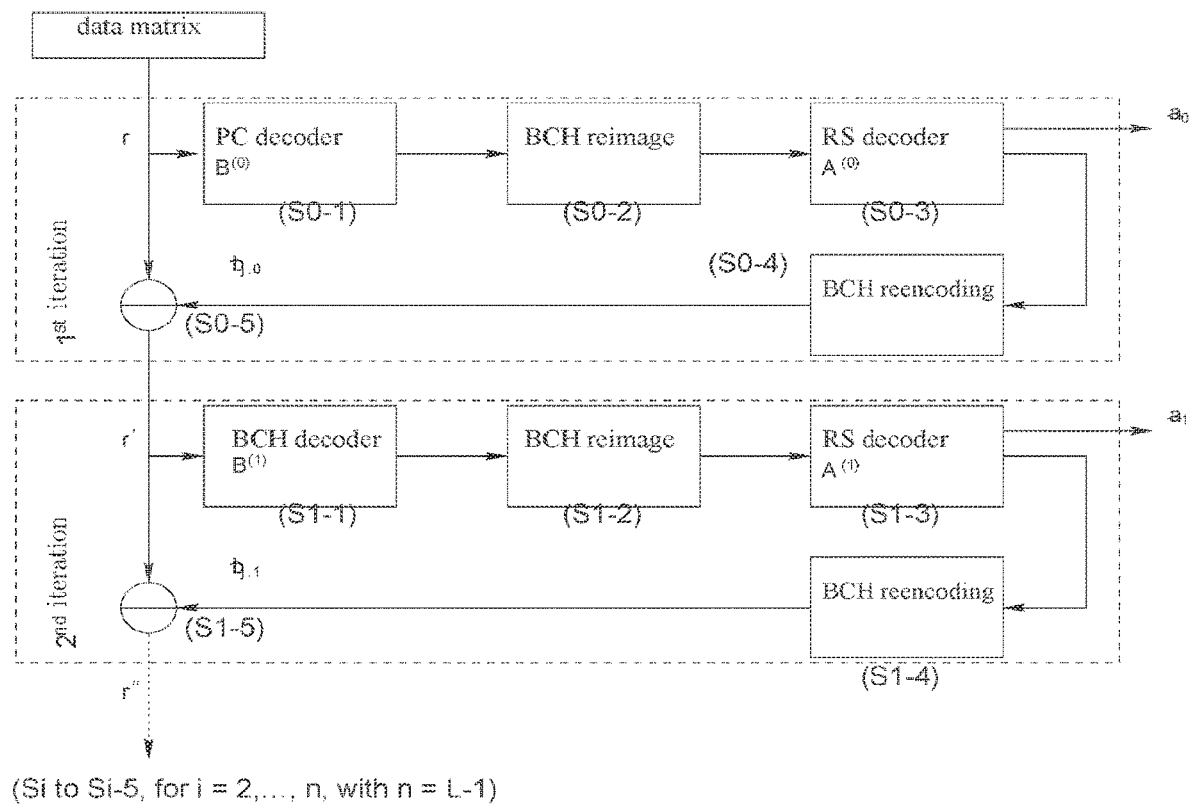
FIG. 4 schematically illustrates a decoding scheme for a codeword matrix obtainable from the encoding scheme of FIG. 2, according to a preferred embodiment of the present invention.

The coding methods illustrated by FIGS. 2 to 4 are based on the use of GC codes for error correction in memories, such as flash memories, that require high-rate codes. The GC codes are constructed from inner nested binary Bose-Chaudhuri- Hocquenghem (BCH) codes and outer Reed-Solomon (RS) codes. For the inner codes extended BCH codes are used, where single parity-check codes are applied in the first level of the GC code (cf. FIGS. 2 and 3). This construction enables high-rate GC codes. A corresponding decoding method for the GC codes is illustrated in FIG. 4. A detailed general discussion of GC codes can be found in [5].

Reference is now made to FIG. 2, which illustrates the encoding process of a GC code, according to a preferred embodiment of the present invention. The GC codeword is arranged in an $n_b \times n_a$ matrix, where $n_a$ and $n_b$ are the lengths of the outer and inner codes, respectively. The encoding starts with the outer codes. The rows are protected by L Reed-Solomon codes of length $n_a$, i.e. L denotes the number of levels. m elements of each column represent one symbol from the Galois field $GF(2^m)$. Hence, m neighboring rows form a codeword of an outer code $A^{(i)}$, i=0 . . . , L−1. Note that the code rate of the outer codes increases from level to level. The outer codes protect Lm rows of the matrix. The remaining $n_b$−Lm rows are used for the redundancy of the inner codes.

The shaded area in FIG. 2 illustrates the redundancy of the component codes that are filled by outer and inner encoding. After the outer encoding the columns of the codeword matrix are encoded with binary inner codes of length $n_b$. Each column of the codeword matrix is the sum of L codewords of nested linear BCH codes.

$$B^{(L-1)} \subseteq B^{(L-2)} \subseteq \ldots \subseteq B^{(0)} \quad (1)$$

Hence, a higher level code is a sub-code of its predecessor, where the higher levels have higher error correcting capabilities, i.e., $t_{b,L-1} \geq t_{b,L-2} \geq \ldots \geq t_{b,0}$, where $t_{b,i}$ is the error correcting capability of level i. The code dimensions are $k^{(0)}=Lm$, $k^{(1)}=(L-1)m$, . . . , $k^{(L-1)}=m$.

The codeword $b_j$ of the j-th column is the sum of L codewords.

$$b_j = \sum_{i=0}^{L-1} b_j^{(i)} \quad (2)$$

These codewords $b_j^{(i)}$ are formed by encoding the symbols $a_{j,i}$ with the corresponding sub-code $B^{(i)}$, where $a_{j,i}$ is the j-th symbol (m bits) of the outer code $A^{(i)}$. For this encoding (L−i−1)m zero bits are prefixed onto the symbol $a_{j,i}$. Note that the j-th column $b_j$ is a codeword of $B^{(0)}$, because of the linearity of the nested codes.

FIG. 3 illustrates this encoding scheme in more detail based on a simple exemplary case (Example 1) where L=2, m=3 and $n_a=n_b=7$. Thus, in this example there are only L=2 levels and with $m_1$=m=3 bits per symbol the outer RS codes are constructed over the Galois field $GF(2^3)$, while for the sake of simplicity the inner extended BCH codes are defined over $GF(2^1)$, i.e. $m_2$=1. In a first step S1, a data structure representing a $n_b \times n_a$ (i.e. 7×7) matrix D is filled with data to be encoded and consisting of 24 information bits $i_0$ to $i_{23}$. The filling scheme corresponds to that of the data matrix D in FIG. 2. Accordingly, in the first level (i=0) the number of information bits is lower than in the second level (i=1) and the remaining prefixed bits of both levels are reserved for the redundancy added by the outer encoding in a next step S2. Each symbol comprises three neighboring bits of the same column, such that for example in the fifth column of D the bits $i_0$, $i_3$ and $i_6$ form a first symbol in the column, and the bits $i_{11}$, $i_{16}$ and $i_{21}$ form another symbol. In addition, the final row of the matrix D is reserved for redundancy to be added by the inner encoding in a further step S3.

In the outer encoding step S2,1 the information in each of the two levels i=0 and i=1 is encoded by a respective RS code, wherein the code dimension of the outer RS code for level 0 is only $k_a^{(0)}$=3 while the code dimension of level 1 is increased to $k_a^{(1)}$=5. Performing the outer encoding step S2 results in an intermediate matrix A comprising the code symbols $a_{i,j}$, wherein each of these symbols $a_{i,j}$ comprises $m_1$=3 bits and the rows of the matrix A are codewords of the outer code.

In the second level i=1, the respective extended BCH code $B^{(1)}$, which unlike the SPC code does have an error correction capability of 1 Bit, is applied in each column of the matrix A to the respective symbol $a_{j,1}$. As in this simple example this is already the final level, no prefixing of "0" symbols is necessary. Again, an SPC code is applied to the resulting BCH codeword and added in the final row of the respective column j.

In order to arrive at the final GC codeword matrix C, on a column by column basis all of the individual codewords $b_j^{(i)}$ of all levels i of column j are added according to formula (2) above in order to receive the corresponding codeword $b_j$ which then forms column j of the resulting GC codeword matrix C, as again exemplarily illustrated in FIG. 3 for column j=4.

In a further example (Example 2) corresponding to FIG. 2, we consider a GC code suitable for error correction in flash memories. The GC code is designed for 2 KB information blocks, i.e., a code which can be used to store 2 KB of data plus 4 bytes of meta information. For this GC code we use L=13 levels with inner nested BCH codes over $GF(2^7)$, i.e. $m_2$=7, and outer RS codes over $GF(2^9)$ (i.e. $m_1$=9). In the first level i=0, we apply single parity-check codes SPC. Hence, all inner codes are extended BCH codes of length $n_b$=13·9+1=118.

The outer RS codes are constructed over the Galois field $GF(2^9)$. Hence, the code dimension of the inner codes is reduced by $m_1$=9 bits with each level. The GC code is constructed from L=13 outer RS codes of length $n_a$=152. The parameters of the codes are summarized in Table I, where we use the same RS code in each of levels 4 to 12. The code has overall code dimension $k = m \sum_{j=0}^{L-1} k_{a,j} = 16416$ and length $n = n_a n_b = 17936$.

In the inner encoding step S3 each of the symbols $a_{i,j}$ of the intermediate matrix A is individually encoded by a corresponding inner code in the form of an extended BCH code $B^{(i)}$. In the first level i=0, the respective extended BCH code $B^{(0)}$ is a mere Single Parity Check (SPC) code. Accordingly, as exemplarily illustrated in FIG. 3 for symbol $a_{4,0}$, each of symbols $a_{0,j}$ of level 0 (j=0, . . . , 6) is encoded by prefixing (L−i−1)$m_1$, i.e. (2−0−1)*3=3 zero bits (i.e. a "0" symbol) onto the symbol and applying an SPC code to the two symbols which is added in the final row of the column representing a resulting codeword $b_j^{(0)}$ for column j and level 0.

TABLE I

| j | $k_{b,j}$ | $d_{b,j}$ | $k_{a,j}$ | $d_{a,j}$ |
|---|---|---|---|---|
| 0 | 117 | 2 | 84 | 69 |
| 1 | 108 | 4 | 130 | 23 |
| 2 | 99 | 6 | 136 | 17 |
| 3 | 90 | 8 | 142 | 11 |
| 4-12 | 81 | 12 | 148 | 5 |

Table I shows parameters of the example code. In the table, $k_{b,j}$ and $d_{b,j}$ are the code dimension and minimum Hamming Distance of the binary inner code of level j. The terms $k_{a,j}$ and $d_{a,j}$ are the code dimension and minimum Hamming Distance of the outer RS codes.

This code has a code rate R=0.915. It is also able to correct burst errors. The minimum distance of all outer RS code is greater than or equal to five. Hence, each outer code can correct at least two erroneous symbols and consequently two columns of the codeword matrix may be corrupted by an arbitrary number of errors.

FIG. 4 schematically illustrates a corresponding decoding scheme for a codeword matrix r obtainable, in principle, from the encoding scheme of FIG. 2, according to a preferred embodiment of the present invention. In fact, the codeword matrix r to be decoded may differ from the original codeword matrix C resulting from application of the encoding scheme of FIG. 2 when the data to be decoded was previously encoded (e.g. before storing it to a memory), by one or more erroneous symbols caused by an undesired modification of the original codeword matrix C. Such modification might for example be caused by one or more failing memory cells within the memory device, by memory degradation, by write or read disturbs or by other impacts on the data.

The decoder, e.g. of the coding device in memory controller 2 of FIG. 1, processes the received data matrix r level by level starting with i=0 up to the last level i=n with n=L−1, where i is the index of the current level. FIG. 4 depicts the decoding steps Si−1 to Si−5. First the columns of the data matrix r are decoded with respect to $B^{(i)}$ (Si−1) and the information bits have to be inferred (re-image, Si−2) in order to retrieve the code symbols $a_{i,j}$ of $A^{(i)}$, where j is the column index. If all symbols of the code $A^{(i)}$ are inferred the RS code can be decoded (Si−3). At this point a partial decoding result a; is available. Finally, this result has to be re-encoded (Si−4) using $B^{(i)}$. The estimated codewords of the inner code $B^{(i)}$ are subtracted (Si−5) from the codeword matrix before the next level can be decoded.

A similar encoding and decoding process is also described in detail in [14]. However, in deviation thereof, according to the present invention in the first level i=0, only error detection for the single parity-check codes can be applied (S0−1). The single parity-check code can detect any error of odd weight. If an error is detected in column j, the corresponding symbol $a_{0,j}$ is considered an erasure. After the evaluation of the single parity-check codes error and erasure decoding for the RS code can be applied (cf. [15]). Starting with the second level, the structure of the nested-BCH codes can be exploited, i.e. a BCH code can be decoded that can correct a single bit error per codeword. Due to the extension of the BCH code any error of weight two can be detected. In this case, a decoding failure is declared for the inner code, where the decoding failures of the inner codes are regarded as erased symbols of the RS code. Hence, error and erasure decoding is used in all levels of the RS code.

Figure 5:
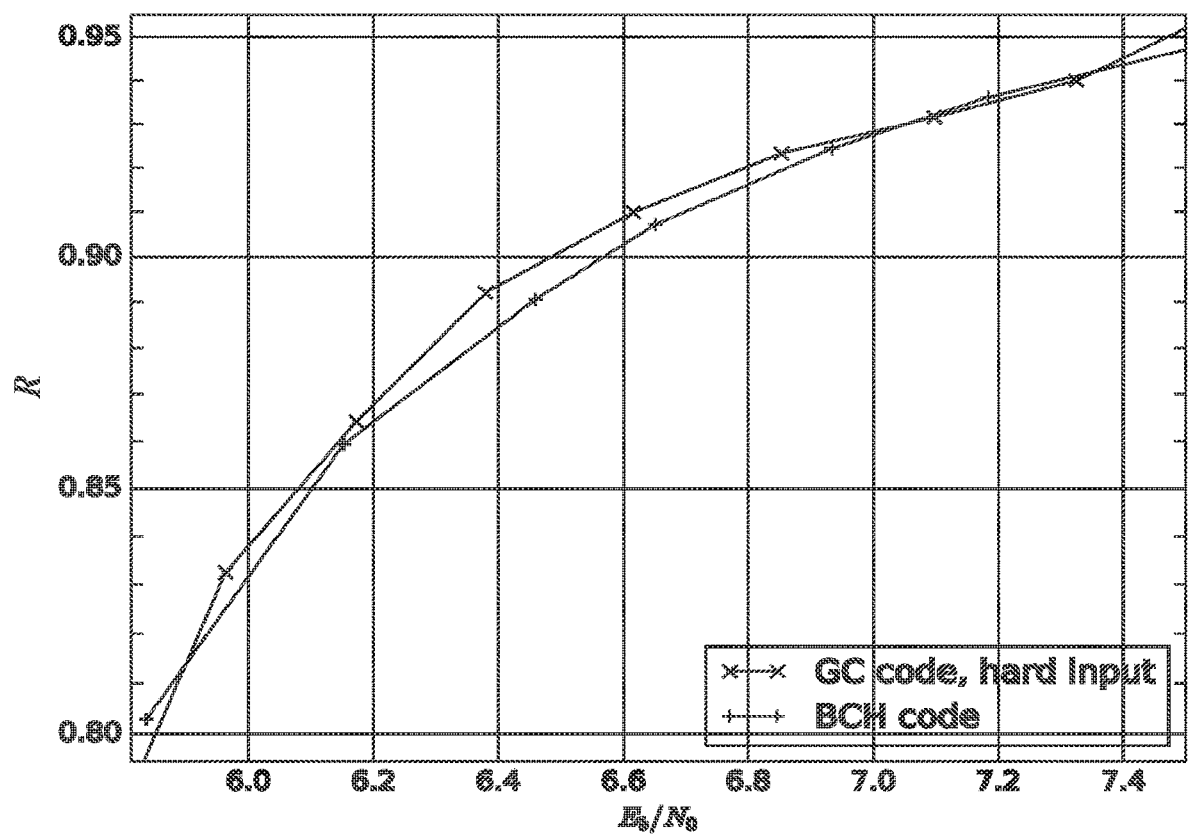
FIG. 5 shows a diagram plotting the code rate vs. signal-to-noise ratio for exemplary GC codes according to the present invention in comparison with long BCH codes with algebraic decoding.

FIG. 5 illustrates error correction performance of an exemplary GC code according to the present invention. Specifically, it shows a diagram plotting the code rate vs. signal-to-noise ratio SNR ("$E_b/N_0$") for the exemplary GC code in comparison with long BCH codes with algebraic decoding. As performance measure, the code rate that is required to guarantee an overall block error rate of less than $10^{-16}$ for a given channel error probability is used. Clearly, the comparison shows that the achievable code rate of the GC code is higher than the code rate of the long BCH codes across almost all values of the SNR.

All individual codes of this exemplary GC code are constructed similar to the code presented in Example 2 above. In particular, the inner codes are chosen according to Table I above, whereas the error correcting capability of the outer codes is adapted to obtain the highest possible code rate for a channel error probability. Note that in this example, the overall code rate of the GC code is at most R=0.99, because of the choice of the inner code. In contrast, the codes presented in [2], [4] only have a code rate less than or equal to 0.9.

While above at least one exemplary embodiment of the present invention has been described, it has to be noted that a great number of variations thereto exists. Furthermore, it is appreciated that the described exemplary embodiments only illustrate non-limiting examples of how the present invention can be implemented and that it is not intended to limit the scope, the application or the configuration of the herein-described apparatus' and methods. Rather, the preceding description will provide the person skilled in the art with constructions for implementing at least one exemplary embodiment of the invention, wherein it is understood that various changes of functionality and the arrangement of the elements of the exemplary embodiment can be made, without deviating from the subject-matter defined by the appended claims and their legal equivalents.

REFERENCES

[1] A. Fahrner, H. Griesser, R. Klarer, and V. Zyablov, "Low-complexity GEL codes for digital magnetic storage systems," *IEEE Transactions on Magnetics*, vol. 40, no. 4, pp. 3093-3095, July 2004.

[2] J. Freudenberger, U. Kaiser, and J. Spinner, "Concatenated code constructions for error correction in non-volatile memories," in *Int. Symposium on Signals, Systems, and Electronics (ISSSE)*, Potsdam, October 2012, pp. 1-6.

[3] J. Freudenberger, J. Spinner, and S. Shavgulidze, "Generalized concatenated codes for correcting two-dimensional clusters of errors and independent errors," in *Int. Conference on Communication and Signal Processing (CSP)*, Castelldefels-Barcelona, February 2014, pp. 1-5.

[4] J. Spinner and J. Freudenberger, "Decoder architecture for generalized concatenated codes," *IET Circuits, Devices & Systems*, vol. 9, no. 5, pp. 328-335, 2015.

[5] I. Dumer, *Concatenated codes and their multilevel generalizations,* in Handbook of Coding Theory, Vol. II, Elsevier, Amsterdam, 1998.

[6] M. Bossert, *Channel coding for telecommunications,* Wiley, 1999.

[7] V. Zyablov, S. Shavgulidze, and M. Bossert, "An introduction to generalized concatenated codes," *European Transactions on Telecommunications*, vol. 10, no. 6, pp. 609-622, 1999.

[8] R. Micheloni, A. Marelli, and R. Ravasio, Error Correction Codes for *Non-Volatile Memories*, Springer, 2008.

[9] X. Zhang and K. K. Parhi, "High-speed architectures for parallel long BCH encoders," *IEEE Transactions on Very Large Scale Integration (VLSI) Systems*, vol. 13, no. 7, pp. 872-877,2005.

[10] F. Sun, S. Devarajan, K. Rose, and T. Zhang, "Design of on-chip error correction systems for multilevel NOR and NAND flash memories," *IET Circuits, Devices Systems*, vol. 1, no. 3, pp. 241-249, June 2007.

[11] E. Yaakobi, J. Ma, L. Grupp, P. Siegel, S. Swanson, and J. Wolf, "Error characterization and coding schemes for flash memories," in *IEEE GLOBECOM Workshops*, December 2010, pp. 1856-1860.

[12] E. Yaakobi, L. Grupp, P. Siegel, S. Swanson, and J. Wolf, "Characterization and error-correcting codes for TLC flash memories," in *Computing, Networking and Communications (ICNC), 2012 International Conference on*, January 2012, pp. 486-491.

[13] J. Freudenberger and J. Spinner, "A configurable Bose-Chaudhuri-Hocquenghem codec architecture for flash controller applications," *Journal of Circuits, Systems, and Computers*, vol. 23, no. 2, pp. 1-15, February 2014.

[14] J. Spinner and J. Freudenberger, "Design and implementation of a pipelined decoder for generalized concatenated codes," in *Proceedings of 27th Symposium on Integrated Circuits and Systems Design (SBCCI)*, Aracaju, Brazil, September 2014, pp. 1-16.

[15] L. Weiburn and J. Cavers, "Improved performance of Reed-Solomon decoding with the use of pilot signals for erasure generation," in *Vehicular Technology Conference, 1998. VTC 98. 48th IEEE,* vol. 3, May 1998, pp. 1930-1934 vol.3.

[16] U. Wachsmann, R. Fischer, and J. Huber, "Multilevel codes: theoretical concepts and practical design rules," *IEEE Transactions on Information Theory,* vol. 45, no. 5, pp. 1361-1391, July 1999.

[17] J. Spinner and J. Freudenberger, "Soft input decoding of generalized concatenated codes using a stack decoding algorithm," in *Proceedings of 2nd BW-CAR Symposium on Information and Communication Systems (SInCom),* December 2015, pp. 1-5.

The following is a summary list of reference numerals and the corresponding structure used in the above description of the invention:

1 memory system
2 memory controller, including coding device
2a processing unit
2b embedded memory of memory controller
3 nonvolatile memory, particularly flash memory
4 host
A1 address line(s)
D1 data line(s)
C1 control line(s)
A2 address bus
D2 data bus
C2 control bus

The invention claimed is:

1. A method of error correction encoding of data to be stored in a memory device, the method comprising:
providing a coding device;
using the coding device to subject the data to error correction encoding based on generalized concatenated coding (GCC) to obtain encoded data;
wherein:
the GCC is constructed from L inner nested binary extended BoseChaudhuri-Hocquenghem (BCH) codes and L outer codes, where L≥2 and L is a positive integer;
an extended BCH code in a lowest nesting level of the inner nested BCH codes is a mere single parity-check (SPC) code; and
an extended BCH code in at least one higher nesting level of the inner nested BCH codes has an error correction capability and is a sub-code of the BCH code of the lowest nesting level.

2. The method according to claim 1, wherein the outer codes are Reed-Solomon (RS) codes.

3. The method according to claim 2, the method further comprising:
applying an error correction encoding including:
arranging the data to be encoded into a two-dimensional data matrix having a first dimension $n_a$ equal to a length of the outer RS codes and a second dimension $n_b$ equal to a length of the inner extended BCH codes, wherein a line of a first dimension of a matrix is a row of the matrix and a line of a second dimension thereof is a column of the matrix, or vice versa, and the outer RS codes are defined over a Galois-Field $GF(2^{m_1})$ with $m_1$ elements of each line of the second dimension representing one symbol of the Galois-Field $GF(2^{m_1})$, wherein $m_1$ is a positive integer;
applying the L outer RS codes to respective $L*m_1$ lines of the first dimension of the data matrix such that each of the L outer RS codes yields a codeword from respective $m_1$ lines of the second dimension and in total $L*m_1$ lines of the resulting intermediate matrix are protected by the outer RS codes; and
thereafter applying the inner nested extended BCH codes to the lines of the second dimension of the intermediate matrix to obtain a codeword matrix comprising the encoded data, with $n_b-L*m_1$ lines of the first dimension of the codeword matrix being used for a coding redundancy of the inner nested extended BCH codes and each line of the second dimension of the codeword matrix being a sum of the L codewords of the individual nested extended BCH codes for the respective line.

4. The method according to claim 3, wherein a codeword $b_j$ of a j-th line of the second dimension of the codeword matrix is determined by the following formula:

$$b_j = \sum_{i=0}^{L-1} b_j^{(i)}$$

wherein the codewords $b_j^{(i)}$ are formed by encoding the symbols $a_{j,i}$ with the extended BCH code $B^{(i)}$ of an $i^{th}$ nesting level, where $a_{i,j}$ is a j-th symbol, of $m_1$ bits, of the $i^{th}$ outer RS code $A^{(i)}$ along the first direction of the intermediate matrix and for this encoding $(L-i-1)*m1$ zero bits are prefixed or postfixed onto the symbol $a_{j,i}$.

5. The method according to claim 3, wherein the code rate of the first RS codeword defined along the direction of the second dimension of the intermediate matrix is lower than the code rate of the $L^{th}$ RS codeword defined along that direction.

6. The method according to claim 3, wherein the inner extended BCH codes are defined over a Galois-Field $GF(2^{m_2})$ and $m_1$ is different from $m_2$, and wherein $m_2$ is a positive integer.

7. The method according to claim 6, wherein one of the following pairs is true:
$m_1=8$ and $m_2=6$; or
$m_1=9$ and $m_2=7$.

8. The method according to claim 6, wherein $m_1=9$ and $m_2=7$ and a number of nesting-levels for the inner extended BCH codes is 13, with $n_a=152$ and $n_b=118$; and
for each of the nesting-levels j a corresponding code dimension of the inner extended BCH code $k_{b,j}$ and a minimum Hamming distance $d_{b,j}$ thereof as well as a corresponding code dimension $k_{a,j}$ of the outer RS code and a minimum Hamming distance $d_{a,j}$ thereof are provided by the following table:

| j | $k_{b,j}$ | $d_{b,j}$ | $k_{a,j}$ | $d_{a,j}$ |
|---|---|---|---|---|
| 0 | 117 | 2 | 84 | 69 |
| 1 | 108 | 4 | 130 | 23 |
| 2 | 99 | 6 | 136 | 17 |
| 3 | 90 | 8 | 142 | 11 |
| 4-12 | 81 | 12 | 148 | 5 |

9. The method according to claim 3, wherein, in the step of applying the inner nested extended BCH codes to the lines of the second dimension of the intermediate matrix, calculating at least one of the nesting levels the single parity bit of the respective extended BCH code of the one nesting level from a predefined strict subset of the bits of the respective line of the second dimension.

10. The method according to claim 1, the method further comprising:
transmitting the encoded data to one or more memory devices and storing the encoded data in the one or more memory devices.

11. A method of error correction encoding of data, the method comprising:
using a coding device to subject the data to error correction encoding based on generalized concatenated coding (GCC) to obtain encoded data;
wherein:
the GCC is constructed from L inner nested codes and L outer codes, where L≥2 and L is a positive integer;
an inner nested code in a lowest nesting level of the L inner nested codes is a of lower complexity than at least another one of the L inner nested codes; and
the other one of the L inner nested codes has an error correction capability and is a sub-code of the inner nested code in the lowest nesting level.

12. The method of claim 11, wherein the L inner nested codes are binary extended BoseChaudhuri-Hocquenghem (BCH) codes.

13. The method of claim 11, wherein the inner nested code in a lowest nesting level is a single parity-check (SPC) code.

14. The method of claim 11, wherein the outer codes are Reed-Solomon (RS) codes.

15. The method of claim 14, wherein the L inner nested codes are binary extended BoseChaudhuri-Hocquenghem (BCH) codes, the method further comprising:
applying an error correction encoding including:
arranging the data to be encoded into a two-dimensional data matrix having a first dimension $n_a$ equal to a length of the outer RS codes and a second dimension $n_b$ equal to a length of the inner extended BCH codes, wherein a line of a first dimension of a matrix is a row of the matrix and a line of a second dimension thereof is a column of the matrix, or vice versa, and the outer RS codes are defined over a Galois-Field $GF(2^{m_1})$ with $m_1$ elements of each line of the second dimension representing one symbol of the Galois-Field $GF(2^{m_1})$, wherein $m_1$ is a positive integer;
applying the L outer RS codes to respective $L*m_1$ lines of the first dimension of the data matrix such that each of the L outer RS codes yields a codeword from respective $m_1$ lines of the second dimension and in total $L*m_1$ lines of the resulting intermediate matrix are protected by the outer RS codes; and
thereafter applying the inner nested extended BCH codes to the lines of the second dimension of the intermediate matrix to obtain a codeword matrix comprising the encoded data, with $n_b-L*m_1$ lines of the first dimension of the codeword matrix being used for a coding redundancy of the inner nested extended BCH codes and each line of the second dimension of the codeword matrix being a sum of the L codewords of the individual nested extended BCH codes for the respective line.

16. The method of claim 15, wherein a codeword $b_j$ of a j-th line of the second dimension of the codeword matrix is determined by the following formula:

$$b_j = \sum_{i=0}^{L-1} b_j^{(i)}$$

wherein the codewords $b_j^{(i)}$ are formed by encoding the symbols $a_{j,i}$ with the extended BCH code $B^{(i)}$ of an $i^{th}$ nesting level, where $a_{i,j}$ is a j-th symbol, of $m_1$ bits, of the $i^{th}$ outer RS code $A^{(i)}$ along the first direction of the intermediate matrix and for this encoding $(L-i-1)*m1$ zero bits are prefixed or postfixed onto the symbol $a_{j,i}$.

17. The method of claim 15, wherein the code rate of the first RS codeword defined along the direction of the second dimension of the intermediate matrix is lower than the code rate of the $L^{th}$ RS codeword defined along that direction.

18. The method of claim 15, wherein the inner extended BCH codes are defined over a Galois-Field $GF(2^{m_2})$ and $m_1$ is different from $m_2$, and wherein $m_2$ is a positive integer.

19. The method of claim 18, wherein one of the following pairs is true:
$m_1=8$ and $m_2=6$; or
$m_1=9$ and $m_2=7$.

20. The method of claim 18, wherein $m_1=9$ and $m_2=7$ and a number of nesting-levels for the inner extended BCH codes is 13, with $n_a=152$ and $n_b=118$; and
for each of the nesting-levels j a corresponding code dimension of the inner extended BCH code $k_{b,j}$ and a minimum Hamming distance $d_{b,j}$ thereof as well as a corresponding code dimension $k_{a,j}$ of the outer RS code and a minimum Hamming distance $d_{a,j}$ thereof are provided by the following table:

| j | $k_{b,j}$ | $d_{b,j}$ | $k_{a,j}$ | $d_{a,j}$ |
|---|---|---|---|---|
| 0 | 117 | 2 | 84 | 69 |
| 1 | 108 | 4 | 130 | 23 |
| 2 | 99 | 6 | 136 | 17 |
| 3 | 90 | 8 | 142 | 11 |
| 4-12 | 81 | 12 | 148 | 5 |

* * * * *